United States Patent
Furukawa (10) Patent No.: US 6,362,626 B2
(45) Date of Patent: Mar. 26, 2002

(54) CELL VOLTAGE MEASURING DEVICE FOR CELL MODULE

(75) Inventor: Kimihiko Furukawa, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/822,415

(22) Filed: Apr. 2, 2001

(30) Foreign Application Priority Data

Apr. 3, 2000 (JP) ............................................. 12-101598

(51) Int. Cl.[7] .......................... H02J 7/00; G01N 27/416
(52) U.S. Cl. ........................................ 324/429; 320/120
(58) Field of Search ........................... 324/429; 320/120, 320/121, 122

(56) References Cited

U.S. PATENT DOCUMENTS 5,744,936 A * 4/1998 Kawakami .................. 320/120
6,239,579 B1 * 5/2001 Dunn et al. .................. 320/121
6,249,125 B1 * 6/2001 Haddad et al. ............. 324/426

* cited by examiner

Primary Examiner—Gregory Toatley
(74) Attorney, Agent, or Firm—Rader, Fishman & Grauer, PLLC (57) ABSTRACT

The invention provides a cell voltage measuring device for a cell module wherein component cells are theoretically divided into a plurality of (n) cell blocks 111 to 11n. A plurality of potential detecting lines extending from respective potential detecting points of each of the cell blocks are provided with potential holding means 12 having capacitor blocks each for holding the potentials of the potential detecting points of the cell block, and cell voltage measuring means 14 for measuring the voltage of the cells based on the potentials of the potential detecting points held by the potential holding means 12. Flying capacitors are provided for each cell block.

2 Claims, 7 Drawing Sheets

CELL VOLTAGE MEASURING DEVICE FOR CELL MODULE

FIELD OF THE INVENTION

The present invention relates to a cell voltage measuring device for a cell module comprising a plurality of cells connected together in series.

BACKGROUND OF THE INVENTION

Attention has been directed in recent years to environmental technology with consideration given to global environmental problems such as ozone hole and global warming. In the motor vehicle industry, efforts have been devoted to the development of electric motor vehicles with diminished carbon dioxide emissions. As power sources for such vehicles, cell modules having a great capacity are used in which secondary cells, typical of which are lithium ion cells or nickel hydrogen cells, are connected in series.

Secondary cells, typical of which are lithium ion secondary cells, cause undesirable troubles such as liquid leakage or heat generation if overcharged or overdischarged, so that each cell needs to be checked for voltage by monitoring. Furthermore, handling a cell module of large capacity having great energy requires safety measures such as electrical insulation of the module and the circuit in the vicinity thereof. Accordingly, techniques for measuring the voltage of each cell accurately with safety are important for cell modules of large capacity for use as power sources for electric motor vehicles.

Figure 2:
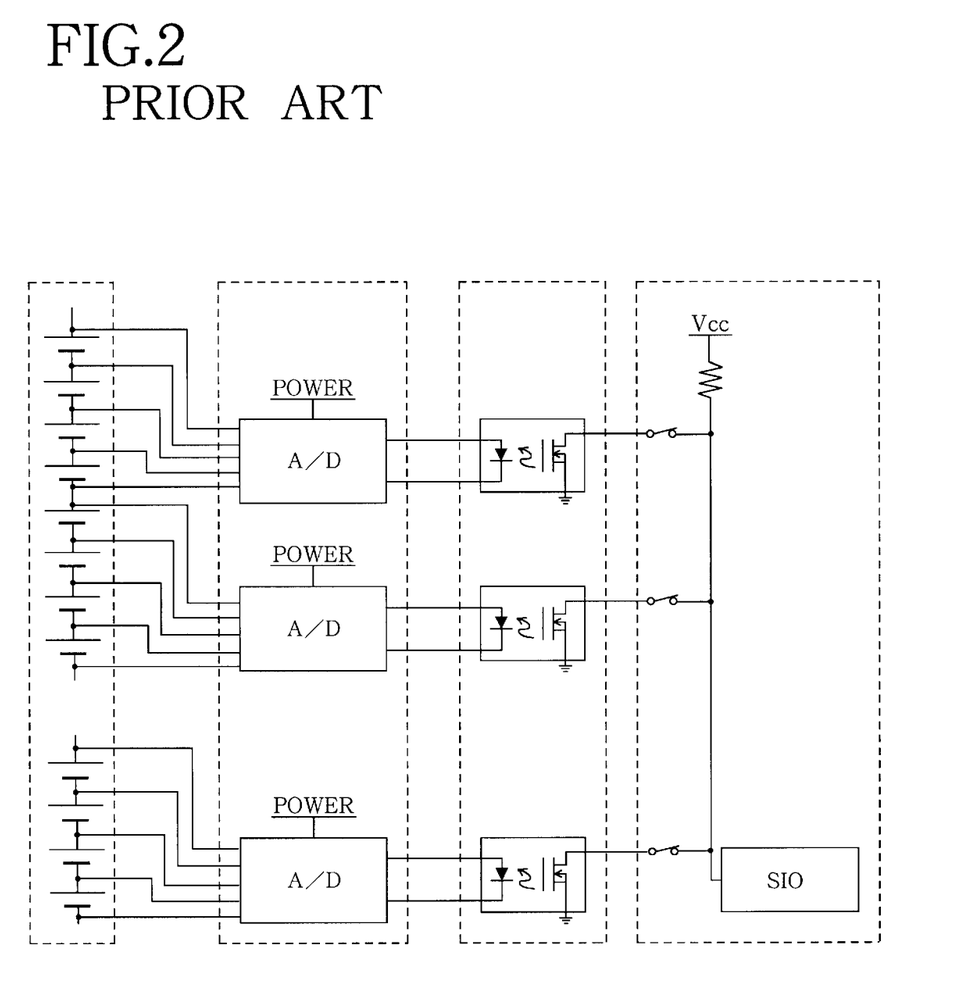
FIG. 2 is a circuit diagram showing a conventional cell voltage measuring device.

Cell voltage measurement of such cell modules having a great capacity is conventionally done, for example, by dividing the module into blocks of several cells, multiplexing the cell voltages of each block and converting the voltages to digital values, and obtaining cell voltages in terms of digital values as shown in FIG. 2. However, this method requires many AD converters, and the power sources for the AD converters need to be insulated, consequently entailing the problem of necessitating a complex circuit and a higher cost.

Figure 3:
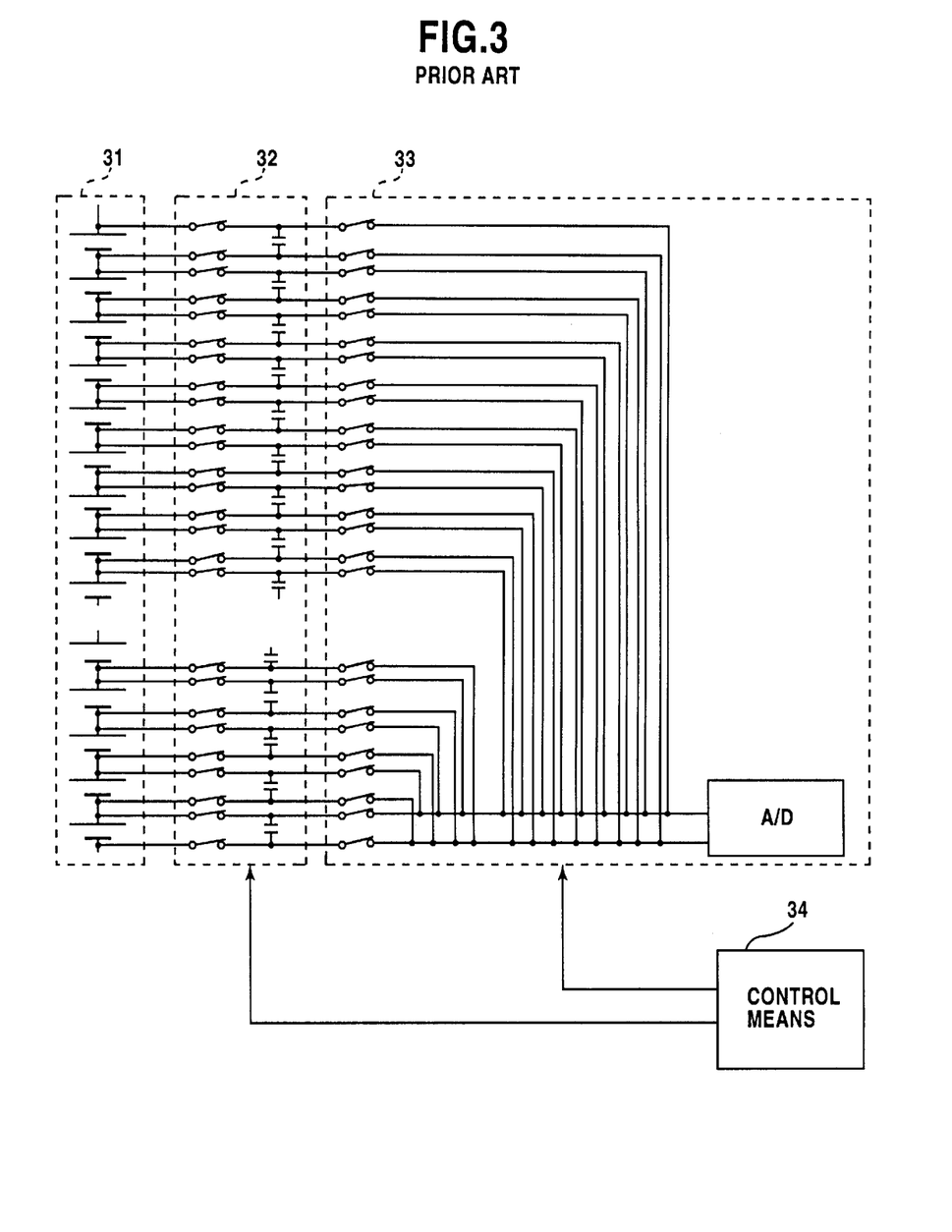
FIG. 3 is a circuit diagram showing another conventional cell voltage measuring device.

Accordingly, the cell voltage measuring method with use of so-called flying capacitors has attracted attention in recent years. With reference to FIG. 3 showing an example of arrangement of flying capacitors, indicated at 31 is a cell module, at 32 potential holding means, at 33 cell voltage measuring means, and at 34 control means. With the method of FIG. 3, the switches of the potential holding means 32 are turned on first to cause the capacitors of the means 32 to hold potentials of the cell module 31, and the switches are thereafter turned off to electrically insulate the cell module 31 from the potential holding means 32. The capacitor corresponding to the cell to be checked for voltage is connected to an A/D converter to measure the cell voltage by the measuring means 33. The cell voltage of the cell module 31 can be measured by this method, with the module 31 electrically insulated from the cell voltage measuring means 33.

Figure 4:
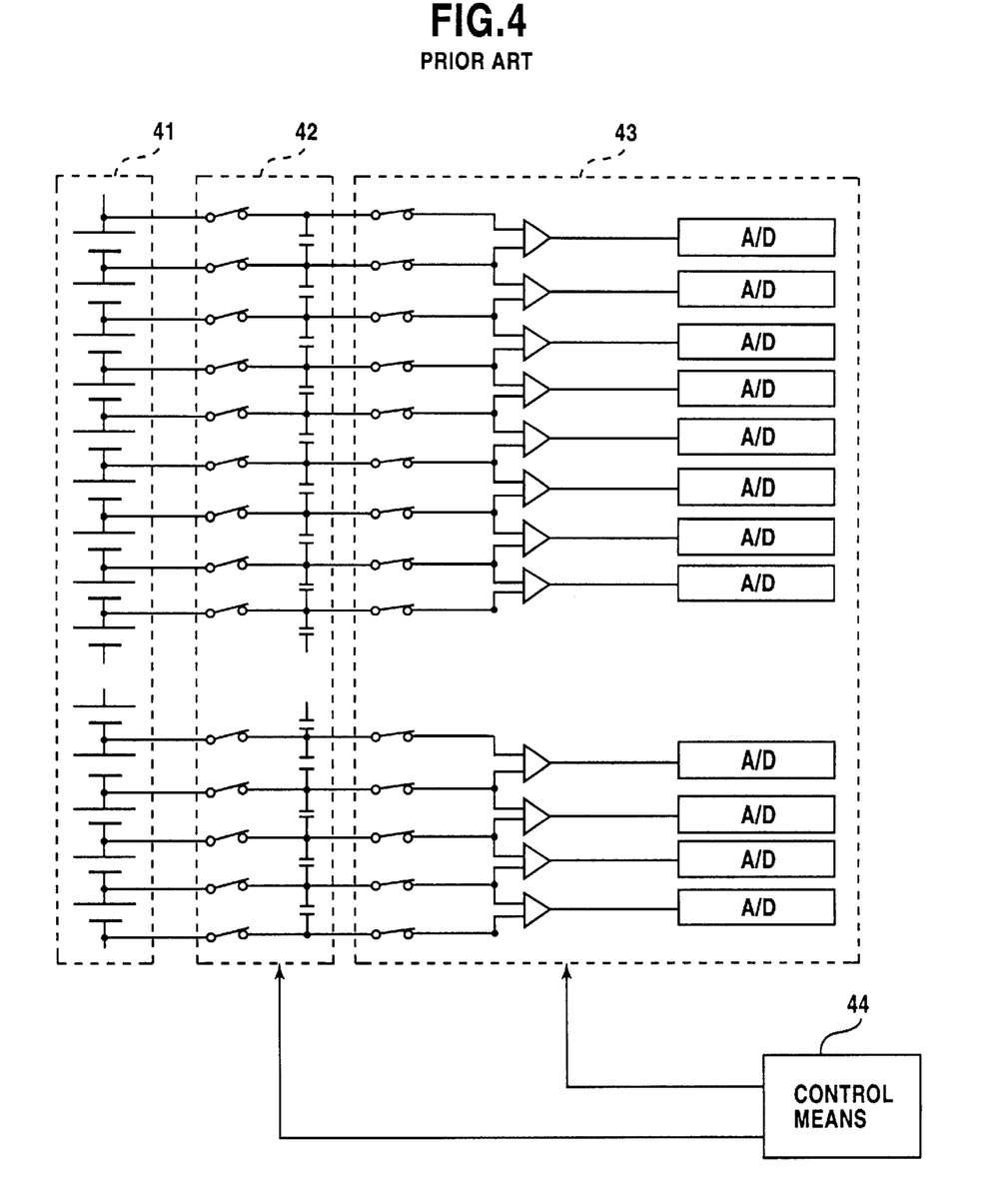
FIG. 4 is a circuit diagram showing still another conventional cell voltage measuring device.

FIG. 4 shows another example of arrangement of flying capacitors. Indicated at 41 is a cell module, at 42 potential holding means, at 43 cell voltage measuring means, and at 44 control means. With the illustrated construction like that of FIG. 3, the cell voltage can be measured based on the potential held in the capacitor of the potential holding means 42, with the cell module 41 electrically insulated from the cell voltage measuring means 43.

However, the construction shown in FIG. 3 requires mounting of many switches, necessitating complex wiring and a higher cost. Although the construction shown in FIG. 4 is smaller in the number of switches needed, all the capacitors constituting the potential holding means 42 are connected to one another in series, consequently entailing the need for the cell voltage measuring means 43 to handle a high voltage, so that the device is not useful practically. For example, in the case where 40 lithium ion cells are connected in series, a voltage of 3.6 V×40=144 V must be handled, whereas it is difficult to measure with the same accuracy the cell voltages increasing over a wide range of from 0 to 144 V with an increment of about 3.6 V.

SUMMARY OF THE INVENTION

Accordingly, an object of the present invention is to provide a cell voltage measuring device which is reduced in the number of switches, lower in the voltage to be handled and adapted to measure the voltages of a cell module as electrically insulated.

The present invention provides a cell voltage measuring device for a cell module 11 wherein the component cells are theoretically divided into a plurality of (n) cell blocks 111 to 11$n$. A plurality of potential detecting lines extending from respective potential detecting points of each of the cell blocks are provided with potential holding means 12 for holding the potentials of the potential detecting points of the cell block, and cell voltage measuring means 14 for measuring the voltage of the cells based on the potentials of the potential detecting points held by the potential holding means 12. The potential holding means 12 and the cell voltage measuring means 14 have their operations controlled by control means 17.

The potential holding means 12 comprises: a plurality of (n) pre-switch blocks 121 to 12$n$ connected to the plurality of (n) cell blocks 111 to 11$n$ respectively and each comprising a plurality of switches capable of opening or closing the potential detecting lines extending from the cell block, and a plurality of (n) capacitor blocks 131 to 13$n$ connected to the plurality of (n) cell blocks 111 to 11$n$ by way of the plurality of (n) pre-switch blocks 121 to 12$n$ respectively and each comprising a plurality of capacitors for holding the potentials of the potential detecting points of the cell block. The voltage measuring means 14 comprises:

a plurality of (n) post-switch blocks 141 to 14$n$ connected to the plurality of (n) cell blocks 111 to 11$n$ respectively by way of the potential holding means 12 and each comprising a plurality of switches for opening or closing the potential detecting lines extending from the cell block, and a voltage measuring circuit for selecting voltage signals for each cell block from among those obtained by the potential detecting lines via the post-switch blocks 141 to 14$n$ to measure the voltage of each cell constituting the cell block.

The voltage measuring circuit can be composed of a difference computing circuit 150 for calculating the potential difference between two potential detecting lines extending from electrode terminals of each cell and included among the potential detecting lines from each cell block, and an AD converter 160 having connected thereto output terminals of the computing circuit 150.

With the cell voltage measuring device of the invention for the cell module, the cell module is divided into a plurality of cell blocks, and flying capacitors are provided for each cell block. This feature reduces the number of switches, lowers the voltage to be handled and permits voltage measurement with the module in an electrically insulated state, at the same time.

DETAILED DESCRIPTION OF EMBODIMENT

A cell voltage measuring device embodying the invention for a cell module will be described below with reference to the drawings concerned.

Figure 1:
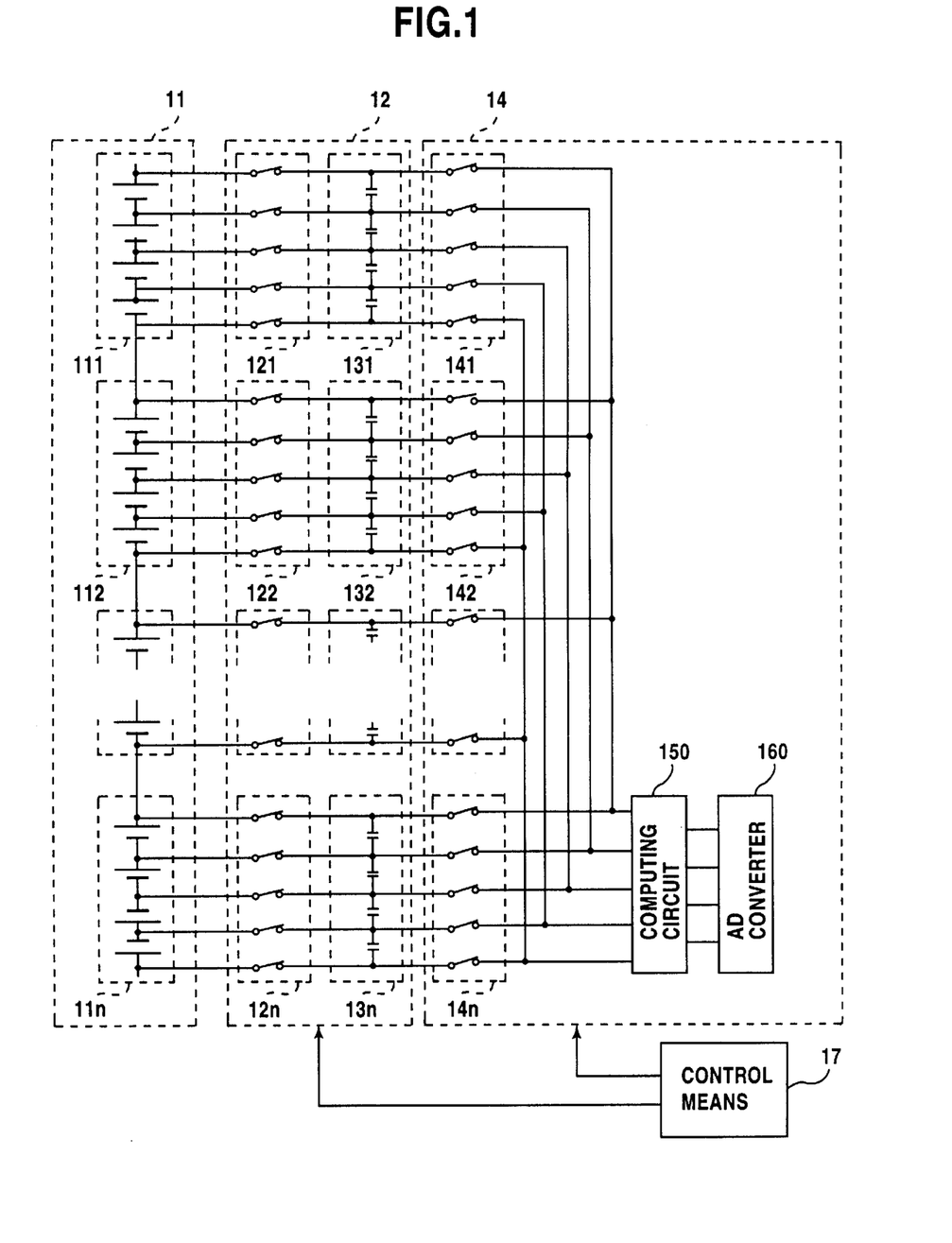
FIG. 1 is a circuit diagram showing the basic construction of a cell voltage measuring device according to the invention.

The basic construction of the device of the invention will be described first. With reference to FIG. 1, a cell module 11 comprising a plurality of secondary cells connected together in series is theoretically divided into a plurality of (n) cell blocks 111 to 11n. A plurality of potential detecting lines extend from the respective potential detecting points (the positive electrode terminal and negative electrode terminal of each cell) of each of the cell blocks. These detecting lines are provided with potential holding means 12 for holding potentials of the potential detecting points of the cell block, and cell voltage measuring means 14 for measuring the voltage of the cells based on the potentials of the potential detecting points held by the means 12. These means 12 and 14 have their operations controlled by control means 17.

The potential holding means 12 comprises:

a plurality of (n) pre-switch blocks 121 to 12n connected to the plurality of (n) cell blocks 111 to 11n respectively and each comprising a plurality of switches capable of opening or closing the potential detecting lines extending from the cell block, and a plurality of (n) capacitor blocks 131 to 13n connected to the plurality of (n) cell blocks 111 to 11n by way of the plurality of (n) pre-switch blocks 121 to 12n respectively and each comprising a plurality of capacitors for holding the potentials of the potential detecting points of the cell block.

The voltage measuring means 14 comprises:

a plurality of (n) post-switch blocks 141 to 14n connected to the plurality of (n) cell blocks 111 to 11n respectively by way of the potential holding means 12 and each comprising a plurality of switches for opening or closing the potential detecting lines extending from the cell block, and a voltage measuring circuit for selecting voltage signals for each cell block from among those obtained by the potential detecting lines via the post-switch blocks 141 to 14n to measure the voltage of each cell constituting the cell block.

The voltage measuring circuit can be composed of a difference computing circuit 150 for calculating the potential difference between two potential detecting lines extending from the electrode terminals of each cell and included among the potential detecting lines from each cell block, and an AD converter 160 having connected thereto the output terminals of the computing circuit 150.

Figure 5:
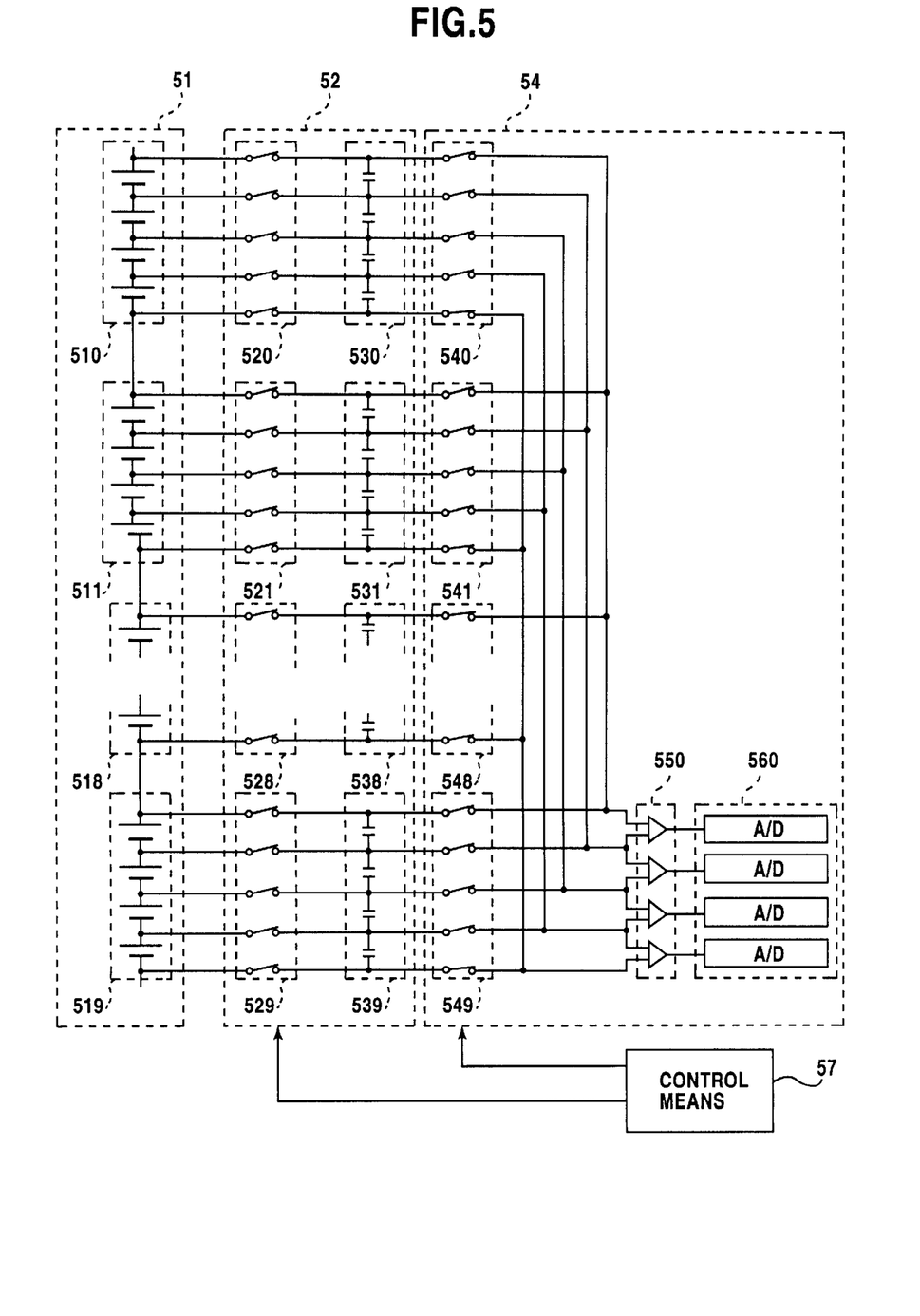
FIG. 5 is a circuit diagram showing a cell voltage measuring device embodying the invention.

With reference to FIG. 5, a detailed description will be given of an embodiment of the invention for a cell module for use in electric motor vehicles. The cell module for use with the present embodiment comprises 40 lithium ion secondary cells 3.6 V in average voltage and connected together in series. The cell voltage is measured every 500 msec.

FIG. 5 shows a cell module 51 comprising 40 lithium ion secondary cells connected in series. Indicated at 510 to 519 are ten cell blocks obtained by theoretically dividing the module 51 of the 40 cells into groups of four cells. Indicated at 520 to 529 are pre-switch blocks each comprising five cell block-connected switches for opening or closing five potential detecting lines extending from five potential measuring points of each of the cell blocks 510 to 519. Each of the switches is realized, for example, by a photo-MOS relay. Indicated at 530 to 539 are capacitor blocks each comprising four capacitors for holding the voltages of the respective cells constituting each of the cell blocks 510 to 519. The capacitors is provided between each pair of adjacent potential detecting lines. Thus, the four capacitors connected to each cell block are connected to one another in series. The pre-switch blocks 520 to 529 and the capacitor blocks 530 to 539 provide potential holding means 52.

To selectively change-over the cell block to be checked for voltage, post-switch blocks 540 to 549 are provided each of which comprises five capacitor-connected switches for opening or closing the five potential detecting lines extending from the five potential measuring points of each of the cell blocks 510 to 519. Each of the switches is realized, for example, by a photo-MOS relay.

Figure 6:
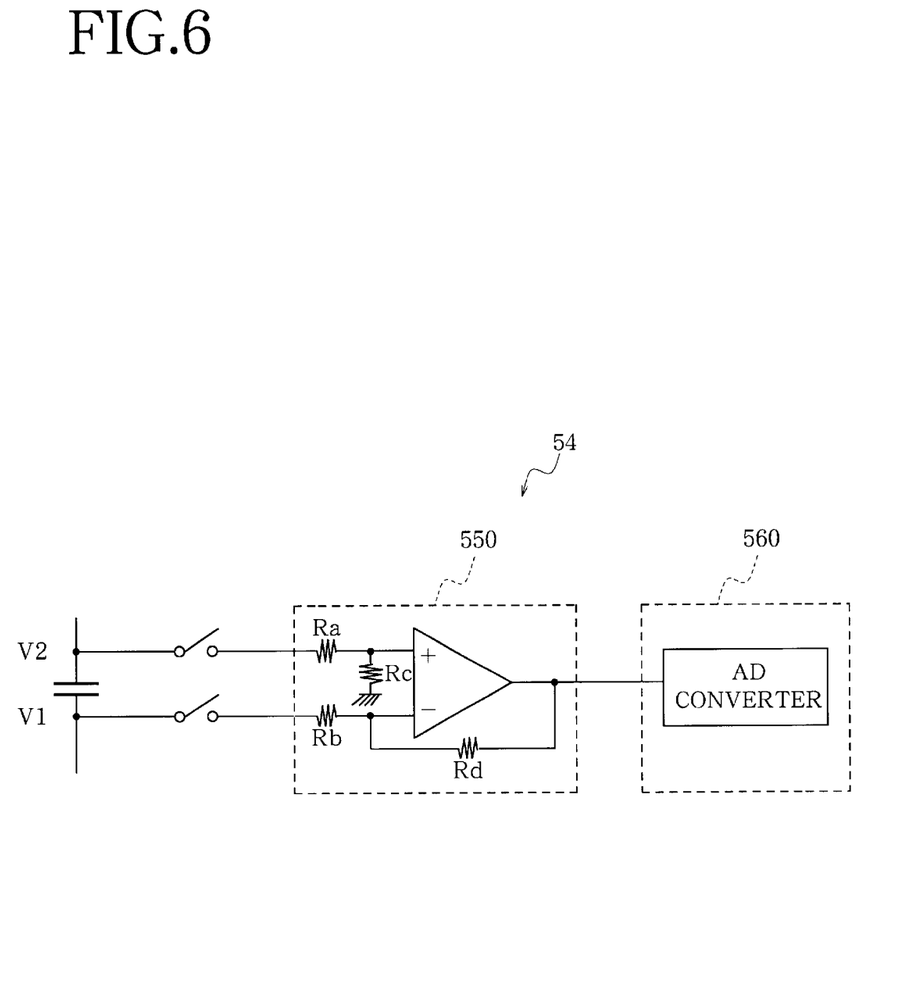
FIG. 6 is a circuit diagram showing the construction of a difference computing circuit.

Indicated at 550 is a differential computing circuit for measuring the terminal voltage of each of the four capacitors connected together in series as stated above and constituting each of the capacitor blocks 530 to 539. The circuit is realized, for example, by a circuit of FIG. 6 wherein Ra=Rb=Rc=Rd. With reference to the circuit of FIG. 6, if the current input to or output from the capacitor is not negligible, a measure is taken as by subjecting the voltage of the capacitor to AD conversion before the voltage is altered with the current input or output.

Indicated at 560 in FIG. 5 is an AD converter for converting the output of the differential computing circuit 550 to a digital value. According to the present embodiment, the converter is a four-channel AD converter so that the voltages of the four cells constituting one cell block can be processed collectively. The post-switch block 540 to 549, the differential computing circuit 550 and the AD converter 560 provide cell voltage measuring means 54.

Indicated at 57 is control means for controlling the circuit elements constituting the potential holding means 52 and the cell voltage measuring means 54. The control means is realized, for example, by software on a microcomputer.

Figure 7:
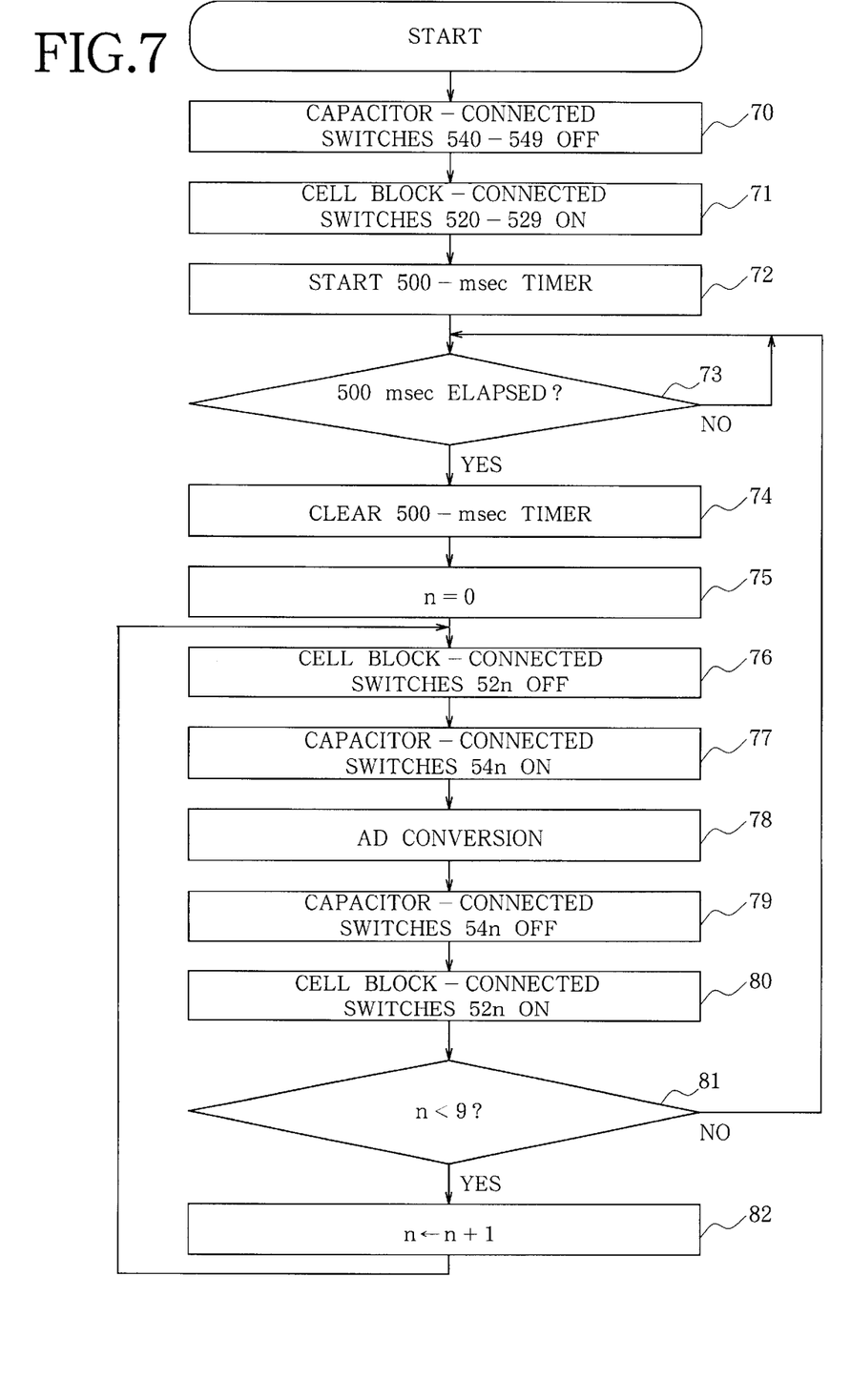
FIG. 7 is a flow chart showing a control operation involved in the operation of the cell voltage measuring device embodying the invention.

Next, with reference to FIG. 7, a description will be given of the cell voltage measuring procedure to be performed by the control means 57. First in step 70, all the capacitor-connected switches constituting the post-switch blocks 540 to 549 are set in an initial state, i.e., off (open) state. In the subsequent step 71, all the cell block-connected switches constituting the pre-switch blocks 520 to 529 are set in an initial state, i.e., on (closed) state. A timer for counting up 500 msec is started in step 72 for the start of counting of 500 msec. An inquiry is made in step 73 as to whether 500 msec has elapsed. If the inquiry is answered in the affirmative, step 74 follows.

In step 74, the timer for counting 500 msec is cleared. In step 75, a loop counter n is cleared to 0 which is used for performing steps 76 to 80 for each of the ten cell blocks, and the control means executes steps 76 to 80 for the cell block $51_n$. In step 76, the five cell block-connected switches constituting the pre-switch blocks 52n are set off. In this stage, the voltages of the respective cells of the cell block 51n are held in the respective capacitors of the capacitor blocks 53n, which are held electrically insulated from the cell blocks 510. For example, in view of the delay of the photo-MOS relay serving as the cell block-connected switch, a waiting time, for example, of about 3 msec may be provided after the pre-switch block 52n is set off.

The four capacitor-connected switches constituting the post-switch blocks 54n are then set on in step 77, whereby the differential computing circuit 550 and the capacitor block 53n are connected to each other. The voltage of the four cells held in the capacitor block 53n is subjected to AD conversion in step 78. In this stage, the cell module 51 is electrically insulated from the AD converter 560, while the voltage applied to the differential computing circuit 550 is as low as 14.4 V which is the voltage of four lithium ion cells (3.6 V×4), so that the AD conversion can be effected at low voltage.

The four capacitor-connected switches of the post-switch block 54n are subsequently set off in step 79. For example, in view of the delay of the photo-MOS relay serving as the capacitor-connected switch, a waiting time, for example, of about 3 msec may be provided after the post-switch block 54n is set off.

The four cell block-connected switches constituting the pre-switch block 52n are thereafter set on in step 80, whereby charging of the capacitor block 53n is started. An inquiry is made in step 81 as to whether the count on the loop counter n is smaller than 9. If the answer is negative, the sequence returns to step 73 to repeat the same procedure, whereas if the answer is affirmative, the loop counter n is advanced by 1 to execute the process for the next cell block. Consequently, the process of steps 76 to 80 is performed for all the cell blocks 511 to 519 to check all the cells constituting the cell module for voltage.

With the cell voltage measuring device of the invention for the cell module, the cell module is divided into a plurality of cell blocks, and flying capacitors are provided for each cell block. This feature reduces the number of switches, lowers the voltage to be handled and permits voltage measurement with the module in an electrically insulated state, at the same time.

What is claimed is:

1. A cell voltage measuring device for a cell module comprising a plurality of cells connected together in series, the cells constituting the cell module being theoretically divided into a plurality of (n) cell blocks (111) to (11n), a plurality of potential detecting lines extending from respective potential detecting points of each of the cell blocks and being provided with potential holding means (12) for holding the potentials of the potential detecting points of the cell block, and cell voltage measuring means (14) for measuring the voltage of the cells based on the potentials of the potential detecting points held by the potential holding means (12), control means (17) being operable for controlling the operations of the potential holding means (12) and the cell voltage measuring means (14), the potential holding means (12) comprising:

a plurality of (n) pre-switch blocks (121) to (12n) connected to the plurality of (n) cell blocks (111) to (11n) respectively and each comprising a plurality of switches capable of opening or closing the potential detecting lines extending from the cell block, and a plurality of (n) capacitor blocks (131) to (13n) connected to the plurality of (n) cell blocks (111) to (11n) by way of the plurality of (n) pre-switch blocks (121) to (12n) respectively and each comprising a plurality of capacitors for holding the potentials of the potential detecting points of the cell block, the voltage measuring means (14) comprising:

a plurality of (n) post-switch blocks (141) to (14n) connected to the plurality of (n) cell blocks (111) to (11n) respectively by way of the potential holding means (12) and each comprising a plurality of switches for opening or closing the potential detecting lines extending from the cell block, and a voltage measuring circuit for selecting voltage signals for each cell block from among those obtained by the potential detecting lines via the post-switch blocks (141) to (14n) to measure the voltage of each cell constituting the cell block.

2. A cell voltage measuring device according to claim 1 wherein the voltage measuring circuit comprises a difference computing circuit (150) for calculating the potential difference between two potential detecting lines extending from electrode terminals of each cell and included among the potential detecting lines from each cell block, and an AD converter (160) having connected thereto output terminals of the computing circuit (150).

* * * * *